US012066507B2

(12) United States Patent
Tanaka et al.

(10) Patent No.: US 12,066,507 B2
(45) Date of Patent: Aug. 20, 2024

(54) SUPERCONDUCTING PHASE SHIFTER

(71) Applicants: National Institute of Advanced Industrial Science and Technology, Tokyo (JP); NATIONAL INSTITUTE FOR MATERIALS SCIENCE, Tsukuba (JP); Tokyo University of Science Foundation, Tokyo (JP)

(72) Inventors: Yasumoto Tanaka, Ibaraki (JP); Hirotake Yamamori, Ibaraki (JP); Takashi Yanagisawa, Ibaraki (JP); Shunichi Arisawa, Ibaraki (JP); Taichiro Nishio, Tokyo (JP)

(73) Assignees: National Institute of Advanced Industrial Science and Technology, Tokyo (JP); NATIONAL INSTITUTE FOR MATERIALS SCIENCE, Tsukuba-shi (JP); Tokyo University of Science Foundation, Tokyo (JP)

( * ) Notice: Subject to any disclaimer, the term of this patent is extended or adjusted under 35 U.S.C. 154(b) by 268 days.

(21) Appl. No.: 17/781,246

(22) PCT Filed: Nov. 26, 2020

(86) PCT No.: PCT/JP2020/043935
§ 371 (c)(1),
(2) Date: May 31, 2022

(87) PCT Pub. No.: WO2021/111961
PCT Pub. Date: Jun. 10, 2021

(65) Prior Publication Data
US 2023/0003813 A1  Jan. 5, 2023

(30) Foreign Application Priority Data
Dec. 1, 2019  (JP) .................... 2019-217659

(51) Int. Cl.
*G01R 33/035* (2006.01)
*G06N 10/00* (2022.01)
*H10N 60/12* (2023.01)

(52) U.S. Cl.
CPC ......... *G01R 33/0354* (2013.01); *G06N 10/00* (2019.01); *H10N 60/12* (2023.02)

(58) Field of Classification Search
CPC ............ G01R 33/0354; G01R 33/1238; G06N 10/00; G06N 10/40; H10N 60/12; H10N 69/00

(Continued)

(56) References Cited

U.S. PATENT DOCUMENTS 5,185,527 A * 2/1993 Bluzer .................. H10N 60/84
505/848
2007/0174227 A1* 7/2007 Johnson ................ B82Y 10/00
706/62

(Continued)

FOREIGN PATENT DOCUMENTS

JP  2005-513600 A  5/2005
WO  03/052438 A1  6/2003

OTHER PUBLICATIONS

Michael Tinkham, "Introduction to Superconductivity", Second Edition, McGraw-Hill, 1996, pp. 1-441 (236 pages total).

(Continued)

*Primary Examiner* — Christopher P Mcandrew
(74) *Attorney, Agent, or Firm* — Sughrue Mion, PLLC

(57) ABSTRACT

Proposed is a phase shift introduction method, a structure, and a circuit device for eliminating or minimizing a risk associated with dissimilar materials, solving in principle a problem of mixing of a signal current and a control current that occurs due to DC connection of a phase shifter to a signal line, and stably and reliably providing a phase shift (Continued)

that is desired to be introduced without being adversely effected by noise generated by an ambient magnetic field, which is generated due to use of an external power supply. A structure according to the present invention includes a phase shifter 101 and a closed-loop circuit 103 that is directly used for computation or storage, and a quantum phase shift is generated in the closed-loop circuit 103 by using a fractional flux quantum captured by the phase shifter 101 that is DC-separated from the closed-loop circuit 103.

19 Claims, 7 Drawing Sheets

(58) Field of Classification Search
USPC .......................................................... 324/248
See application file for complete search history.

(56) References Cited

U.S. PATENT DOCUMENTS

2017/0228483 A1* 8/2017 Rigetti ...................... G06N 7/00
2018/0040935 A1* 2/2018 Sliwa ....................... H03F 3/605

OTHER PUBLICATIONS

A.J. Leggett, "Macroscopic Quantum Tunnelling and Related Effects in Josephson Systems", Percolation, Localization, and Superconductivity, 1984 (41 pages total).
A.J. Leggett et al., "Dynamics of the dissipative two-state system", Review of Modern Physics, 1987, vol. 59, No. 1, pp. 1-85 (87 pages total).
Mark F. Bocko et al., "Prospects for Quantum Coherent Computation Using Superconducting Electronics", IEEE Transactions on Applied Superconductivity, ResearchGate, 1997 (5 pages total).
T.P. Orlando et al., "Superconducting persistent-current qubit", Physical Review B, 1999, vol. 60, No. 22, pp. 398-413 (16 pages total).
J.E. Mooij et al., "Josephson Persistent-Current Qubit", Science, 1999, vol. 285, pp. 1036-1039 (5 pages total).
Caspar H. van der Wal et al., "Quantum Superposition of Macroscopic Persistent-Current States", Science, 2000, vol. 290, pp. 773-777 (6 pages total).
I. Chiorescu et al., "Coherent Quantum Dynamics of a Superconducting Flux Qubit", Science, 2003, vol. 299, pp. 1869-1871 (4 pages total).
Shunta Asada et al., "Design and evaluation of single flux quantum circuits using local flux bias", IEICE-SCE, 2020 (3 pages total).
Written Opinion of the International Searching Authority dated Feb. 22, 2021 in International Application No. PCT/JP2020/043935.
International Search Report dated Feb. 22, 2021 in International Application No. PCT/JP2020/043935.
Soya Taniguchi et al., "Cryogenic ferromagnetic patterns with controlled magnetization for superconducting phase-shift elements", Japanese Journal of Applied Physics, 2015, vol. 54, pp. 043101-1-043101-4 (5 pages total).
J.B. Majer et al., "Simple phase bias for superconducting circuits", Applied Physics Letters, 2002, vol. 80, No. 19, pp. 3638-3640 (4 pages total).
D. Balashov et al., "Passive Phase Shifter for Superconducting Josephson Circuits", IEEE Transactions on Applied Superconductivity, 2007, vol. 17, No. 2, pp. 142-145 (4 pages total).
U. Kienzle et al., "Spectroscopy of a fractional Josephson vortex molecule", Physical Review B, 2012, vol. 85, pp. 014521-1-014521-8 (8 pages total).
Y. Tanaka, "Soliton in Two-Band Superconductor", Physical Review Letters, 2002, vol. 88, No. 1, pp. 017002-1-017002-3 (3 pages total).
Yasumoto Tanaka et al., "Interpretation of Abnormal AC Loss Peak Based on Vortex-Molecule Model for a Multicomponent Cuprate Superconductor", Japanese Journal of Applied Physics, 2007, vol. 53, pp. 134-145 (14 pages total).

D.J. Van Harlingen, "Phase-sensitive tests of the symmetry of the pairing state in the high-temperature superconductors—Evidence for $d_{x2-y2}$ symmetry", Reviews of Modern Physics, 1995, vol. 67, No. 2, pp. 515-535 (23 pages total).
D.A. Wollman et al., "Experimental Determination of the Superconducting Pairing State in YBCO from the Phase Coherence of YBCO-Pb dc SQUIDs", Physical Review Letters, 1993, vol. 71, No. 13, pp. 2134-2137 (4 pages total).
R.R. Schulz et al., "Design and realization of an all d-wave dc $\pi$-superconducting quantum interference device", Applied Physical Letters, 2000, vol. 76, No. 7, pp. 912-914 (4 pages total).
Horst Rogalla et al., "100 Years of Superconductivity", Physics, 2011 (436 pages total).
T. Ortlepp et al., "RSFQ Circuitry Using Intrinsic $\pi$-Phase Shifts", IEEE Transactions on Applied Superconductivity, 2007, vol. 17, No. 2, pp. 659-663 (5 pages total).
G. Blatter et al., "Quantum computing with superconducting phase qubits", Physica C, 2001, vol. 352, pp. 105-109 (5 pages total).
A.I. Buzdin et al., "Critical-current oscillations as a function of the exchange field and thickness of the ferromagnetic metal (F) in an S-F-S Josephson junction", JETP Lett, 1982, vol. 35, No. 4, pp. 178-180 (4 pages total).
Taro Yamashita, "Superconducting Quantum Computer Capable of Large-Scale Computation Using Magnetic Body", JST new technology presentation meeting document, 2019 (27 pages total).
Sergey Maksimovich Frolov, "Current-Phase Relations of Josephson Junctions With Ferromagnetic Barriers", 2005 (149 pages total).
V.V. Ryazanov et al., "Coupling of Two Superconductors through a Ferromagnet: Evidence for a $\pi$ Junction", Physical Review Letters, 2001, vol. 86, No. 11, pp. 2427-2430 (4 pages total).
Taro Yamashita et al., "NbN-Based Ferromagnetic 0 and $\pi$ Josephson Junctions", Physical Review Applied, 2017, vol. 8, pp. 054028-1-054028-5 (5 pages total).
T. Yamashita et al., "Superconducting $\pi$ Qubit with a Ferromagnetic Josephson Junction", Physical Review Letters, 2005, vol. 95, pp. 097001-1-097001-4 (4 pages total).
T. Yamashita et al., "Superconducting $\pi$ qubit with three Josephson junctions", Applied Physics Letters, 2006, vol. 88, pp. 132501-1-132501-3 (4 pages total).
Yuki Yamanashi et al., "Design methodology of single-flux quantum flip-flops composed of both 0- and $\pi$ shifted Josephson junctions", Superconductor Science and Technology, 2018, vol. 31, pp. 1-7 (8 pages total).
A.V. Ustinov et al., "Rapid single-flux quantum logic using $\pi$-shifters", Journal of Applied Physics, 2003, vol. 94, No. 8, pp. 5405-5407 (4 pages total).
Anthony J. Annunziata et al., "Tunable superconducting nanoinductors", Nanotechnology, 2010, vol. 21, pp. 1-6 (7 pages total).
Ernst Helmut Brandt et al., "Superconducting thin rings with finite penetration depth", Physical Review B, 2004, vol. 69, pp. 184509-1-184509-12 (12 pages total).
Hendrik Bluhm et al., "Magnetic Response of Mesoscopic Superconducting Rings with Two Order Parameters", Physical Review Letters, 2006, vol. 97, pp. 237002-1-237002-4 (4 pages total).
Y. Tanaka et al., "Experimental formation of a fractional vortex in a superconducting bi-layer", Physica C: Superconductivity and its applications, 2018, vol. 548, pp. 44-49 (8 pages total).
Y. Tanaka et al., "An unconventional vortex state in a superconducting bilayer where one layer has a hole", Solid State Communications, 2018, vol. 277, pp. 39-44 (6 pages total).
Y. Tanaka et al., "Flattened remnant-field distribution in superconducting bilayer", Physica C: Superconductivity and its applications, 2019, vol. 567, pp. 1-5 (5 pages total).
K.G. Stawiasz et al., "Noise Measurements of Series SQUID Arrays", IEEE Transactions on Applied Superconductivity, 1993, vol. 3, No. 1, pp. 1808-1811 (2 pages total).
Richard P. Welty et al., "Two-Stage Integrated Squid Amplifier With Series Array Output", IEEE Transactions on Applied Superconductivity, 1993, vol. 3, No. 1, pp. 2605-2608 (4 pages total).
Boris Chesca et al., "Flux-coherent series SQUID Array magnetometers operating above 77K with superior white flux noise than

(56) References Cited

OTHER PUBLICATIONS single-SQUIDS at 4.2k", Applied Physics Letters, 2015, vol. 107, pp. 162602-1-162602-5 (6 pages total).
Qiyu Zhang et al., "Fabrication and Characteristics of All-NbN SQUID Series Array", IEEE Transactions on Applied Superconductivity, 2020, vol. 30, No. 3 (3 pages total).
Yasushi Tanaka et al., "Research on the Performance of Quantum Partition Element", TIA, 2018 (10 pages total).
Hiroshi Bando et al., "Helium: A Precious Element Diffusing into Space—The History and Future Prospect of its Demand and Supply", J. Cryo. Super. Soc. Jpn., 2013, vol. 48, No. 1 (9 pages total).
J. Jang et al., "Observation of Half-Height Magnetization Steps in $Sr_2RuO_4$", Science, 2011, vol. 331, pp. 186-188 (4 pages total).
Takashi Yanagisawa et al., "Physics and theory of fractional-flux vortices in multi-component superconductors", Summaries of 2018 Autumn Meeting of the Physical Society of Japan, 2018 (4 pages total).
Y. Tanaka et al., "Abnormal Meissner state in a superconducting bilayer", Physica C: Superconductivity and its applications, 2018, vol. 551, pp. 41-47 (7 pages total).

\* cited by examiner

SUPERCONDUCTING PHASE SHIFTER

CROSS REFERENCE TO RELATED APPLICATIONS

This application is a National Stage of International Application No. PCT/JP2020/043935, filed Nov. 26, 2020, claiming priority to Japanese Patent Application No. 2019-217659, filed Dec. 1, 2019.

TECHNICAL FIELD

The present invention relates to a method and a structure for introducing, in electronics that uses superconductivity, a superconducting phase shift by using a fractional flux quantum (a halfway magnetic flux quantum). In addition, the present invention relates to evaluation of an absolute amount of the magnetic flux amount of a fractional flux quantum and a method for searching for a superconducting material that can generate a fractional flux quantum.

BACKGROUND ART

Among superconducting electronics, in electronics using a superconducting phase, a device that produces a superconducting phase shift, that is, a phase shifter is an essential device, and various forms have been proposed. Those methods will hereinafter be described as examples.

Methods for shifting a superconducting phase may be broadly classified into the following five methods.

In other words, the five methods include (1) a method of passing an electric current through a Josephson junction (the method described on p. 196 (6.1) of NPL 1), (2) a method of shifting a phase by using the vector potential of a magnetic field (PTL 1, the method described on p. 202 (6.11) of NPL 1, and NPL 2 to NPL 10), (3) A method of passing an electric current through a place different from a junction in a closed circuit path (NPL 11 to NPL 13), (4) a method of using a phase difference soliton in multicomponent superconductivity (PTL 2 to PTL 6, NPL 14, and NPL 15), and (5) a method of using a Josephson junction that is called a n junction (NPL 7 to NPL 10 and NPL 16 to NPL 30).

CITATION LIST

Patent Literature

PTL 1: U.S. Pat. No. 9,355,365
PTL 2: Japanese Patent No. 4061372
PTL 3: Japanese Patent No. 4010362
PTL 4: Japanese Patent No. 6455929
PTL 5: Japanese Patent No. 5103667
PTL 6: Japanese Patent No. 5352855
PTL 7: U.S. Pat. No. 6,627,916
PTL 8: U.S. Patent Application Publication No. 2003/0027724
PTL 9: U.S. Pat. No. 6,987,282
PTL 10: Japanese Patent No. 4609733
PTL 11: Japanese Patent No. 4235839
PTL 12: Japanese Unexamined Patent Application Publication No. 2012-15427
PTL 13: Japanese Unexamined Patent Application Publication No. 2011-44460

Non Patent Literature

NPL 1: Introduction to Superconductivity", Second Edition, Michael Tinkham, McGraw-Hill, Inc.
NPL 2: Macroscopic quantum tunnelling and related effects in Josephson systems. A. J. Leggett, (Percolation, localization, and superconductivity, edited by Allen M. Goldman and Stuart A. Wolf, Springer-Verlag, Boston, US 1984, ISBN 978-1-4615-9396-6, pp. 1-41).
NPL 3: Dynamics of the dissipative two-state system. A. J. Leggett, S. Chakravarty, A. T. Dorsey, Matthew P. A. Fisher, Anupam Garg, W. Zwerger, A. J. Leggett, Reviews of Modern Physics. Vol. 59, 1-85 (1987) (Erratum Rev. Mod. Phys. 67, 725-726 (1995))
NPL 4: Prospects for quantum coherent computation using superconducting electronics. M. F. Bocko, A. M. Herr, M. J. Feldman. IEEE Transactions on Applied Superconductivity. Volume 7, 3638-3641(1997)
NPL 5: Superconducting persistent-current qubit. T. P. Orlando, J. E. Mooij, Lin Tian, Caspar H. van der Wal, L. S. Levitov, Seth Lloyd, J. J. Mazo. Physical Review B Volume 60, 15398-15413 (1999)
NPL 6: Josephson persistent-current qubit. J. E. Mooij, T. P. Orlando, L. Levitov, Lin Tian, Caspar H. van del Wal, Seth Lloyd. Science, Volume 285. 1036-1039 (1999)
NPL 7: Quantum Superposition of Macroscopic Persistent-Current States. Caspar H. van der Wal, A. C. J. ter Haar, F. K. Wilhelm, R. N. Schouten, C. J. P. M. Harmans, T. P. Orlando, Seth Lloyd, J. E. Mooij. Science Volume 290, Issue 5492, pp. 773-777
NPL 8: Coherent quantum dynamics of a superconducting flux qubit. I. Chiorescu, Y. Nakamura, C. J. P. M. Harmans, J. E. Mooij. Science Vol. 299, pp. 1869-1871 (2003)
NPL 9: Design and evaluation of superconducting single flux quantum circuit using local flux bias. S. Asada, Y. Yamanashi, and N. Yoshikawa. The 66th JSAP Spring Meeting, Abstracts of papers, 10p-5223-8 (Tokyo Institute of Technology, Ookayama Campus, 2019)
NPL 10: Cryogenic ferromagnetic patterns with controlled magnetization for superconducting phase-shift elements. S Taniguchi, H Ito, K Ishikawa, H Akaike, A. Fujimaki, Japanese Journal of Applied Physics Volume 54, 043101 (2015).
NPL 11: Simple phase bias for superconducting circuits. J. B. Majer, J. R. Butcher, J. E. Mooij. Applied Physics Letters Vol. 80, 3638-3640 (2002).
NPL 12: Passive phase shifter for superconducting Josephson circuits. D. Balashov, B. Dimov, M. Khabipov, T. Ortlepp, D. Hagedorn, A. B. Zorin, F.-I. Buchholz, F. H. Uhlmann, J. Niemeyer. IEEE Transactions on Applied Superconductivity Volume 17, 142-145 (2007).
NPL 13: Spectroscopy of a fractional Josephson vortex molecule, U. Kienzle, J. M. Meckbach, K. Buckenmaier, T. Gaber, H. Sickinger, Ch. Kaiser, K. Ilin, M. Siegel, D. Koelle, R. Kleiner, and E. Goldobin. Physical Review B Volume 85, Issue 1, 014521 (2012).
NPL 14: Soliton in two-band superconductor, Y. Tanaka, Physical Review Letter, Volume 88, Number 1, 017002 (2002).
NPL 15: Interpretation of Abnormal AC Loss Peak Based on Vortex-Molecule Model for a Multicomponent Cuprate Superconductor. Y. Tanaka, A. Crisan, D. D. Shivagan, A. Iyo, K. Tokiwa, T. Watanabe. Jpn. Japanese Journal of Applied Physics Vol. 46 (2007) 134-145. (Revised article: Jpn. Japanese Journal of Applied Physics Vol. 53 099202 (2014)).
NPL 16: Phase-sensitive tests of the symmetry of the pairing state in the high-temperature superconductors-Evidence for dx2-y2) symmetry. D. J. Van Harlingen. Reviews of Modern Physics. Vol. 67, Number 2, 515-535 (1995).

NPL 17: Experimental determination of the superconducting pairing state in YBCO from the phase coherence of YBCO-Pb dc SQUIDs. D. A. Wollman, D. J. Van Harlingen, W. C. Lee, D. M. Ginsberg, A. J. Leggett. Physical Review Letters. Vol. 71, 2134-2137 (1993).

NPL 18: Design and realization of an all d-wave dc n-superconducting quantum interference device. R. R. Schulz, B. Chesca, B. Goetz, C. W. Schneider, A. Schmehl, H. Bielefeldt, H. Hilgenkamp, J. Mannhart. Applied Physics Letters Vol. 76, 912-914 (2000).

NPL 19: 100 years of superconductivity. edited by H. Rogalla and P. H. Kes, CRC Press, Taylor & Francis, 2014, ISBN 9781439849484.

NPL 20: RSFQ circuitry using intrinsic π-phase shifts. T. Ortlepp, T. Ortlepp, A. O. Mielke, A. Ariando, C. J. M. Verwijs, K. F. K. Foo, A. Andreski, A. Andreski, H. Rogalla, F. H. Uhlmann, J. W. M. Hilgenkamp. IEEE Transactions on Applied Superconductivity Volume. 17, Issue 2, 659-663 (2007).

NPL 21: Quantum computing with superconducting phase qubits. G. Blatter, V. B. Geshkenbein, A. L. Fauchere, M. V. Feigel'manm, L. B. Ioffe. Physica C Volume 352, 105-109 (2001).

NPL 22: Critical-current oscillations as a function of the exchange field and thickness of the ferromagnetic metal (F) in an S-F-S Josephson junction. A. I. Buzdin, L. N. Bulaevskii, S. V. Panyukov. JETP Letters. Vol. 35, 179-180 (1982).

NPL 23: Superconducting quantum computer capable of being scaled-up by using magnetic material. T. Yamashita. JST new technology presentation meeting document. (Jan. 18, 2019). https://shingi.jst.go.jp/var/rev0/0000/8210/2018_kisoken_5.pdf NPL 24: Current-phase relations of Josephson junctions with ferromagnetic barriers, S. M. Frolov, Dissertation (Doctor of philosophy in physics, University of Illinois as Urbana-Champaing, (2005)).

NPL 25: Coupling of two Superconductors through a ferromagnet: Evidence for a π junction. V. V. Ryazanov, V. A. Oboznov, A. Yu. Rusanov, A. V. Veretennikov, A. A. Golubov, and J. Aarts. Physical Review Letters Vol. 86, Number 11, 2427-2430 (2001).

NPL 26: NbN-based ferromagnetic 0 and π Josephson junctions. T. Yamashita, A. Kawakami, H. Terai. Physical Review Applied. Vol. 8, 054028 (2017).

NPL 27: T. Yamashita, K. Tanikawa, S. Takahashi, and S. Maekawa, Superconducting π Qubit with a Ferromagnetic Josephson Junction, Phys. Rev. Lett. 95, 097001 (2005).

NPL 28: Superconducting qubit with three Josephson junctions. T. Yamashita, S. Takahashi, and S. Maekawa. Applied Physics Letters. Vol. 88, 132501 (2006).

NPL 29: Design methodology of single-flux-quantum flip-flops composed of both 0- and π-shifted Josephson junctions. Y. Yamanashi, S. Nakaishi, A. Sugiyama, N. Takeuchi, N. Yoshikawa. Superconductor Science and Technology. Vol. 31, 105003 (2018).

NPL 30: Rapid single-flux quantum logic using p-shifters. A. V. Ustinov, V. K. Kaplunenko. Journal of Applied Physics Volume 94, 5405 (2003).

NPL 31: Tunable superconducting nanoinductors. Anthony J Annunziata, Daniel F Santavicca, Luigi Frunzio, Gianluigi Catelani, Michael J Rooks, Aviad Frydman, Daniel E Prober, Nanotechnology Volume 21, 445202 (2010).

NPL 32: Superconducting thin rings with finite penetration depth, E. H. Brandt and J. R. Clem, Physical Review B Vol. 69, 184509 (2004).

NPL 33: Magnetic response of mesoscopic superconducting rings with two order parameters, H. Bluhm, N. C. Koshnick, M. E. Huber, and K. A. Moler, Physical Review Letters Volume 97, 237002 (2006).

NPL 34: Experimental formation of a fractional vortex in a superconducting bi-layer. Y. Tanaka, H. Yamamori, T. Yanagisawa, T. Nishio, S. Arisawa, Physica C Volume 548, 44-49 (2018).

NPL 35: An unconventional vortex state in a superconducting bilayer where one layer has a hole. Y. Tanaka, H. Yamamori, T. Yanagisawa, T. Nishio, S. Arisawa, Solid State Communications, Volume 277, 39-44 (2018).

NPL 36: Flattened remnant-field distribution in superconducting bilayer. Y. Tanaka, H. Yamamori, T. Yanagisawa, S. Ooi, M. Tachiki, S. Arisawa. Physica C: Superconductivity and its applications Volume 567, 1253489 (2019).

NPL 37: Noise measurements of series SQUID arrays. K. G. Stawiasz, M. B. Ketchen. IEEE Transactions on Applied Superconductivity. Volume 3, Issue 1, 1808-1811 (1993).

NPL 38: Two-stage integrated SQUID amplifier with series array output. R. P. Welty, J. M. Martinis. Published in: IEEE Transactions on Applied Superconductivity. Volume 3, Issue 1, 2605-2608 (1993).

NPL 39: Flux-coherent series SQUID array magnetometers operating above 77 K with superior white flux noise than single-SQUIDs at 4.2 K.: Boris Chesca, Daniel John, Christopher J. Mellor. Applied Physics Letters. Volume 107, 162602 (2015).

NPL 40: Fabrication and Characteristics of All-NbN SQUID Series Array. Qiyu Zhang, Huiwu Wang, Xin Tang, Wei Peng, and Zhen Wang. IEEE Transactions on Applied Superconductivity. Volume 30, NO. 3, 1600103 (2020).

NPL 41: Quantum Partition Project, TIA Kakehashi projects HP https://www.tia-nano.jp/page/page000292.html.

NPL 42: Helium: A Precious Element Diffusing into Space The History and Future Prospect of its Demand and Supply. H. Bando, Y. Tsuboi, and K. Mori, Cryogenic engineering 48 (2), 68-76, 2013 (Cryogenics and Superconductivity Society of Japan (formerly known as Cryogenic Association of Japan)).

NPL 43: Observation of half-height magnetization steps in Sr2RuO4. J. Jang, D. G. Ferguson, V. Vakaryuk, R. Budakian, S. B. Chung, P. M. Goldbart, Y. Maeno. Science Volume 311, 186-188 (2011).

When an electric current that passes through a Josephson junction is I and the critical current of the Josephson junction is Ic, a phase $\Delta\theta_1$ that is shifted by the method of passing an electric current through a Josephson junction may be expressed by the following equation (the method described on p. 196 (6.1) of NPL 1).

[Math. 1]

$$I = I_c \sin \Delta\theta_1 \quad (1)$$

Equation (1) is the most common phase introduction method. This method is often used as a functional portion of a target arithmetic circuit or memory device and is usually used separately from a phase shifter, which is a phase offset.

In a closed loop, when the total amount of the magnetic flux that passes through the closed loop is Φ, the method for shifting a phase by using the vector potential of a magnetic field is given by the following equation.

[Math. 2]

$$\Delta\theta_2 = 2\pi \frac{\Phi}{\Phi_0} \quad (2)$$

Here, $\Phi$ is given by the following equation as the sum of the amount of the magnetic flux that is generated by a ring current I circulating in the loop and an amount $\Phi_{ex}$ of the magnetic flux that is generated at a portion other than the closed loop and that links with the closed loop. Note that $\Phi_0$ denotes the amount of magnetic flux of a unit flux quantum.

[Math. 3]

$$\Phi = L_{magnetic} I + \Phi_{ex} \quad (3)$$

Here, $L_{magnetic}$ denotes the self-inductance of the closed loop. In other words, the following equation is satisfied.

[Math. 4]

$$\Delta\theta_{3a} = 2\pi \left( \frac{L_{magnetic} I}{\Phi_0} + \frac{\Phi_{ex}}{\Phi_0} \right) \quad (4)$$

A phase that is generated by a method of directly passing the current I may be expressed as:

[Math. 5]

$$\Delta\theta_{3b} = 2\pi \frac{\mu_0 \lambda^2}{\Phi_0} \left( \frac{l}{S} \right) I \quad (5)$$

where $\mu_0$ denotes permeability in vacuum, $\lambda$ denotes London penetration depth (the distance to which a magnetic field penetrates a superconductor when an external magnetic field is applied to the superconductor), S denotes the cross-sectional area of a line forming a circuit, and l denotes the length of a line. In general, as expressed by, for example, Formula (2) in NPL 31,

[Math. 6]

$$L_{kinetic} = \mu_0 \lambda^2 \left( \frac{l}{S} \right) \quad (6)$$

may be defined.

[Math. 7]

$$\Delta\theta_{3b} = 2\pi \frac{L_{kinetic} I}{\Phi_0} \quad (7)$$

Equation (5) may be the above equation.

$L_{kinetic}$ is called kinetic inductance and plays the same role as $L_{magnetic}$ in terms of phase shifting effect. Accordingly, when considering phase shift, the sum of $L_{magnetic}$ and $L_{kinetic}$ can be considered as the inductance, and the inductance is denoted by L. In other words,

[Math. 8]

$$L = L_{magnetic} + L_{kinetic} \quad (8)$$

is satisfied. Although $L_{kinetic} \times I$ does not actually generate a magnetic field, similar to the self-inductance energy of a normal coil, a self-inductance energy $E_{self}$ may be expressed by the following equation.

[Math. 9]

$$E_{self} = \frac{1}{2} L I^2 \quad (9)$$

As described in NPL 32, this self-energy incorporates, by $L_{kinetic}$ the contribution of the kinetic energy of a superconducting electron pair in addition to the energy of a normal magnetic field. Thus, a phase shift due to an external magnetic field and the self-inductance may be expressed as:

[Math. 10]

$$\Delta\theta_3 = \Delta\theta_{3a} + \Delta\theta_{3b} = 2\pi \left( \frac{LI}{\Phi_0} + \frac{\Phi_{ex}}{\Phi_0} \right) \quad (10)$$

by using Equation (4) and Equation (7).

According to NPL 3, in the case of a two-component superconductor, a phase shift due to a phase difference soliton is expressed by the following equation.

[Math. 11]

$$\Delta\theta_4 = \pm 2\pi \frac{\lambda_1^2}{\lambda_1^2 + \lambda_2^2} \quad (11)$$

Here, a superconducting electron-pair density $N_i$ and a superconducting electron-pair mass $m_i$ that are described in NPL 3 are replaced by the London penetration depth in the case where each component is alone, which is expressed by Equation (12). Note that e* denotes the electric charge of an electron pair.

[Math. 12]

$$\lambda_i = \sqrt{\frac{m_i}{\mu_0 N_i e^{*2}}} \quad (12)$$

Equation (11) has plus and minus signs because there are two types of phase difference solitons, which are a right-handed phase difference soliton and a left-handed phase difference soliton. The right-handed phase difference soliton and the left-handed phase difference soliton are usually distinguished from each other by defining one of them as a phase difference soliton and the other as an anti-phase difference soliton. In the present specification, the one that produces a positive phase difference is defined as a phase difference soliton.

A Josephson junction, which is called a π junction, may be further subdivided into the following two junctions.

One of the two junctions is the case where, in a junction including a superconductor in which the order function has a sign inversion such as that seen in d-wave superconductivity, if the junction requires that no phase shift be involved, an odd number of junctions with different sign combinations occur in a loop (i.e., the overlap integral at a junction of the order function becomes negative) (PTL 7, NPL 15 to NPL 21). In this case, in junctions with different sign combinations, the phase is shifted by π radian in order to reduce junction energy (the overlap integral at the junction of the order function becomes positive by shifting the phase). Examples are illustrated in the inset of FIG. 5 on p. 521 of NPL 16, FIG. 1 of p. 912 of NPL 18, and the inset of FIG. 3.34 (a) on p. 194 of NPL 19.

The other of the two junctions is, for example, a junction in which the amplitude of the order function is inverted from positive to negative during the junction without passing an electric current through the junction. An example of this junction is, as described in PTL 8 to PTL 10 and NPL 22 to NPL 30, the case where a magnetic material is used as a barrier. The sign inversion can be directly converted into a phase shift.

The above two phase shifts associated with a sign inversion of the order function are formally expressed by making the value of Ic in Equation (1) negative.

[Math. 13]

$$I=I_c \sin \Delta\theta'_1 = -|I_c| \sin \Delta\theta'_1 = |I_c|\sin(\Delta\theta'_1+\pi) \quad (13)$$

Here, when $\Delta\theta_1=\Delta\theta'_1+\pi$, Equation (13) can be treated equivalently to Equation (1).

Accordingly,

[Math. 14]

$$\Delta\theta_{Total}=\Delta\theta_1+\Delta\theta_2+\Delta\theta_3+\Delta\theta_4 \quad (14)$$

expresses a total phase difference $\Delta\theta_{Total}$.

In a closed circuit, a quantization condition for superconductivity is to return to the original order function after making one round including a sign (univalence of the order function), and thus,

[Math. 15]

$$\Delta\theta_{Total}=2\pi n \quad (15)$$

is satisfied. Note that n is an integer.

Here, in the case where a circuit that is used for storage or computation is a closed circuit, the following phase shift is introduced by considering the current circulating that flows only through the closed circuit (i.e., circulating is a cyclic current that is obtained by removing the contribution of a current that passes through the closed circuit but eventually exits from the closed circuit.).

[Math. 16]

$$\Delta\theta_{3c} = 2\pi\left(\frac{LI_{circulating}}{\Phi_0}\right) \quad (16)$$

In the actual circuit, the phases that are used for computation or storage are typically $\Delta\theta_1$ and $\Delta\theta_{3c}$. The phases $\Delta\theta_1$ and $\Delta\theta_{3c}$ correspond to a "signal phase" (corresponding to a signal voltage of semiconductor electronics), and $\Delta\theta_2+ (\Delta\theta_3-\Delta\theta_{3c})+\Delta\theta_4$ is a phase bias.

SUMMARY OF INVENTION

Technical Problem

The oldest technology of a phase shifter is a method of exposing, by using an external power supply, a closed circuit that is to be used for computation or storage to an external magnetic field that is generated by a coil separated from a target circuit. Representative examples are described in NPL 2 and NPL 3. Research on qubits, which are basic elements of quantum computers, has been actually conducted by using this method (NPL 4 to NPL 8).

However, if a magnetic field is applied to the entire device having a target circuit in order to achieve the above method, a portion that is not desired to be exposed to an external magnetic field will also be exposed to the external magnetic field. Even if a line is drawn to a position near the target circuit in order to prevent such a situation, and a magnetic field is generated by a coil near the target circuit, the magnetic field leaked from the lead-in wire causes a magnetic field to be generated at an unintended place. The biggest problem is that, in both cases, the degree of coupling to an external circuit is large, which in turn results in exposure to the noise generated by the external circuit. There is another problem in that the external circuit and the lead-in wire function as an antenna causing crosstalk with the environment, so that information is dissipated. This will significantly reduce the performance of a qubit if the target circuit is a qubit. This effect has already been discussed in detail in NPL 2 and NPL 3 (Originally, NPL 2 and NPL 3 intentionally employ an external field as a phase shifter as a model for studying how quantum information escapes into an environment. In other words, using this as it is only results in construction of a system that is not suitable for qubits.). From the standpoint of engineering, a lead-in wire line for generating an external magnetic field makes a circuit configuration complex and occupies a large area of a superconducting chip, so that the area available for a functional portion is reduced. Such problems are also simply described in NPL 23.

Even in the case of using a method for shifting a phase by passing a current through a non-junction portion without using a magnetic field, that is, the method expressed by Equation (5), since it is a method that uses, for example, a lead-in wire line and an external power supply (NPL 13), the problem of noise related to a lead-in wire line and an external power supply cannot be solved.

A method for supplying a magnetic field or a current that does not require a current supply from an external power supply so as to be disconnected from the external power supply has been also proposed (NPL 10 to NPL 12).

NPL 10 discloses a method of placing a magnetic material adjacent to a target circuit and using a magnetic field that is generated by the magnetic material. However, as described in the disclosure, the magnitude of the generated magnetic field depends on temperature. This implies that it is difficult to adjust the magnitude of a magnetic field. In addition, a magnetic field affects places other than a target circuit, and thus, there is a problem in that it is difficult to design a circuit for integration.

NPL 11 and NPL 12 propose a method in which a closed circuit that is dc-connected to a target circuit is provided and in which a unit flux quantum is captured in the closed circuit so as to cause a phase shift to occur by using the effect of Equation (5) and the effect of Equation (8). This method requires a closed loop having a geometric size that is approximately equal to or larger than that of a target closed circuit, and thus, there is a disadvantage in that the area of a chip having a circuit cannot be effectively used. In addition, a current that flows for a phase shift and a current that is used for a signal are DC-connected to each other, and thus, both the currents are mixed. The current that is used for a signal can also bypass a control loop, and thus, a problem related to electric current redistribution in the case of integration also becomes complex, which makes circuit design difficult.

In addition, in the method described in NPL 11 and the method described in NPL 12, the critical current of a control loop needs to be greater than the critical current of a Josephson junction of a target circuit. This implies that it is difficult to move a control magnetic flux quantum in and out while maintaining a low temperature (i.e., at a superconducting transition temperature or lower). In other words, circuit reconfiguration cannot be performed while maintaining a low temperature.

Furthermore, a control closed loop also serves as an antenna, and thus, for example, there may be a problem in that it will easily absorb external noise. All of these are structural problems due to the DC coupling of the control loop and the target closed circuit, and these problems cannot be solved as long as this method is used.

In recent years, a $\pi$ junction has attracted attention as a method of achieving a phase shifter without using an additional control loop.

As a $\pi$ junction, a method that uses d-wave superconductivity or the like, which has been described in, has been found to be experimentally possible in NPL 16 to NPL 19 and has been applied to superconducting electronics in PTL 7 and NPL 20.

However, in order to use this method, it is necessary to form a junction between niobium and a copper-oxide high-temperature superconductor such as YBCO or a junction between copper-oxide high-temperature superconductors. This junction technology is so difficult that it cannot be compared with a junction formed by using only niobium and is still in a research stage, and a processing technology at a practical level has not been mature enough.

As a $\pi$ junction, there is also a method that uses a magnetic material. This method is a technology that has been theoretically proposed by NPL 22 more than 30 years ago. However, it takes 15 years to achieve (NPL 25), and the technology is still in a development stage. It is a technology that has recently been introduced in Japan (NPL 26) and is a promising technology.

However, a phase shifter that uses this method needs to be incorporated in a target circuit in a direct current manner due to its structure. A normal junction and a junction using a magnetic material need to be incorporated in the same circuit, and in addition, the absolute values of critical current densities of these junctions need to be the same. High technology is required for adjusting the critical currents of different types of junctions with a favorable mutual affinity, and such a phase shifter has not yet been put to practical use.

In addition, it is not always fit in with superconductivity also in terms of process. In other words, a superconducting material and a magnetic material are alternately handled, and thus, it is difficult to completely eliminate the possibility of occurrence of a trouble such as contamination, which is mixing of a magnetic material into a superconductor. When contamination occurs, the superconducting property is destroyed. This is a disadvantage of using a magnetic material.

In other words, to add a line of a magnetic material that is still in a research stage in terms of materials technology to process lines of aluminum and niobium, which have been used as standard materials for superconducting electronics, has a risk that a currently working superconducting line will stop working.

As a method of causing a phase shift, there is also a method that uses a phase difference soliton. Although this method is very favorable, a line with a phase difference soliton and a line that handles a signal are still connected in a direct current manner. Consequently, there is a technical problem to overcome. This technical problem will now be described.

In the methods that have been proposed in the related art (PTL 2 to PTL 4 and PTL 6), a phase difference soliton is to be generated on the same line as a target circuit. This is because the main purpose of this technology is to use a phase difference soliton itself as an information carrier.

A phase difference soliton is obtained by a special superconductor that is called a multicomponent superconductor, and a method for searching for such a superconductor and a method of achieving such a superconductor have also been proposed (PTL 11 to PTL 13).

Regarding a phase difference soliton, PTL 2 to PTL 6 and PTL 11 to PTL 13 disclose that a multicomponent superconductor that generates a phase difference soliton is used alone for electronics.

The reasons why only using a multicomponent superconductor alone for electronics has been proposed are as follows. A traditional multicomponent superconductor is made of a material different from niobium and aluminum, which are used for standard superconducting electronics, and in the case of trying to use a phase difference obtained by a phase difference soliton by using a line that is DC-connected thereto, it is necessary to connect different types of materials such as a multicomponent superconducting material and niobium.

As mentioned in [0059], it is necessary to establish a process technology for connecting different types of materials, and such a technology has not yet been established. In addition, it is difficult to establish such a technology in the future because it will require a large amount of time and money. It may also become a risk factor for lines in the related art such as that mentioned in [0063].

However, a recent technology that can achieve "multicomponent superconductivity" by using niobium or aluminum has provided a clue to a solution (NPL 33 and NPL 34).

As a result, a "hybrid device" that achieves multicomponent superconductivity and single-component superconductivity by using the same material, which is, for example, niobium, and connects them in a direct-current manner has been proposed (NPL 35 and NPL 36).

Unfortunately, even in the case where a multicomponent superconducting line in which a phase difference soliton has occurred and a single-component superconducting line are connected in a direct-current manner, as mentioned in part of [0054], a problem occurs in that a signal current and a control current are mixed together and flow through the same line.

In order to generate a phase difference soliton, by employing, for example, a method of injecting a current from the outside as described in PTL 4, a portion of the current flows into a single-component superconducting line, which is connected in a direct-current manner, and there is a possibility that the portion of the current will hinder the operation of a circuit. In order to avoid such a situation, a complicated circuit design is required.

In the first place, if a phase difference soliton is not intended to be used as an information carrier and is only used as a phase shifter, and computation or storage is performed by single-component superconductivity of the related art, it is desirable to employ a circuit configuration in which it is not necessary to connect a phase difference soliton and a single-component superconducting line in a direct-current manner so as to avoid interference between them due to the DC connection.

However, a method of incorporating, after a problem that occurs due to DC connection has been avoided in principle, only a phase shift function that is obtained by a phase difference soliton into a single-component superconducting circuit has not been proposed.

In addition, no proposal has been made to avoid problems a π junction has, the problems including a major process change, introduction of dissimilar materials that pose a risk to the permanent operation of the existing infrastructure, and circuit design and manufacturing as a result of employment of a junction using unestablished dissimilar materials.

The present invention has been made in view of the above problems, and it is an object of the present invention to propose a phase shift introduction method, a structure, and a circuit device for eliminating or minimizing a risk associated with dissimilar materials, solving in principle a problem of mixing of a signal current and a control current that occurs due to DC connection of a phase shifter to a signal line, and stably and reliably providing a phase shift that is desired to be introduced without being adversely effected by noise generated by an ambient magnetic field, which is generated due to use of an external power supply.

Solution to Problem

In order to achieve the above object, according to the present invention, as a new idea, a superconductor is disposed directly under or directly above a closed-loop circuit that has single-component superconductivity and that is directly used for computation or storage such that the superconductor is separated from the closed-loop circuit in terms of direct current, and a phase shift is caused to occur in the target closed-loop circuit by using a vector potential that is generated by a fractional flux quantum captured by the superconductor.

Although the fractional flux quantum is assumed to be generated by using a multicomponent superconductor, it is not intended to preclude fractional flux quanta that are obtained by using a π junction such as that disclosed in NPL 19 and NPL 24.

As a multicomponent superconductor, although a thick film such as that described in NPL 33 or NPL 34 is single-component, an ultrathin multilayer film (obtained by stacking at least one superconducting thin film and at least one non-superconducting barrier layer such that the non-superconducting barrier layer is sandwiched between the superconducting thin films) that is thinner than a London penetration depth is assumed to be a superconducting thin film that is multicomponent superconducting. However, it may be any other multicomponent superconductor.

A representative example of a fractional flux quantum is a fractional flux quantum accompanied by a fractional vortex (In the related art, a superconducting vortex has a unit flux quantum. A vortex having an odd amount of magnetic flux, which is not an integral multiple of the unit flux quantum, by a multicomponent effect of multicomponent superconductivity).

In order to keep a fractional vortex captured in a multicomponent superconductor, a pinning center may sometimes be introduced.

NPL 35 and NPL 36 disclose that, in a thin film obtained by sandwiching an ultrathin barrier layer between superconducting ultrathin films of a bi-layer film, a fractional vortex is likely to be generated by forming a hole only in one of the superconducting ultrathin films. It is also effective to utilize a fractional vortex generated in the manner described above as a fractional vortex.

In addition, the fractional flux quantum may be a fractional flux quantum captured in a through hole extending through superconducting ultrathin films and an ultrathin barrier layer.

In order to generate a fractional vortex, cooling a superconductor while applying a magnetic field to the superconductor and then capturing the superconductor may be considered.

The fractional vortex may be a fractional vortex that is generated by applying a lower critical magnetic field to a superconductor, which generates a fractional vortex, at a low temperature.

In a thin film obtained by sandwiching an ultrathin barrier layer between superconducting ultrathin films of a bi-layer film, the fractional vortex may be a fractional vortex that is generated by applying, between the layers, a current that exceeds the critical current between the layers at a low temperature.

The type of a circuit that is to be subjected to a phase shift is not limited as long as it is a closed circuit.

In particular, the circuit is most practically useful when it is a superconducting quantum interference device (SQUID) that includes one or more Josephson junctions. In other words, a qubit or a memory device of a single-flux-quantum (SFQ) circuit corresponds to it.

In the case where a target circuit has a SQUID structure, conversely, the absolute value of a phase shift amount can be accurately observed from the critical current density of the SQUID.

In other words, in the case where a phase shifter is formed of an unknown superconductor, it is obvious that the amount of fractional flux quanta can be determined from a phase shift amount, and it functions as a superconductivity detection circuit that determines whether the unknown superconductor is multicomponent superconductivity.

As described in NPL 37 to NPL 40, a particularly useful method for achieving the above object is to connect a large number of SQUIDs in series.

DESCRIPTION OF EMBODIMENTS

An embodiment of the present invention will be described below.

Features of the present invention are that a phase shifter and a target circuit in which the phase shifter operates are separated from each other in terms of direct current and that the phase shifter is also completely disconnected from an external power supply. Other features of the present invention are that the place where the phase shifter operates most effectively is the target circuit and that the effect of the phase shifter on other places is minimized.

Figure 1:
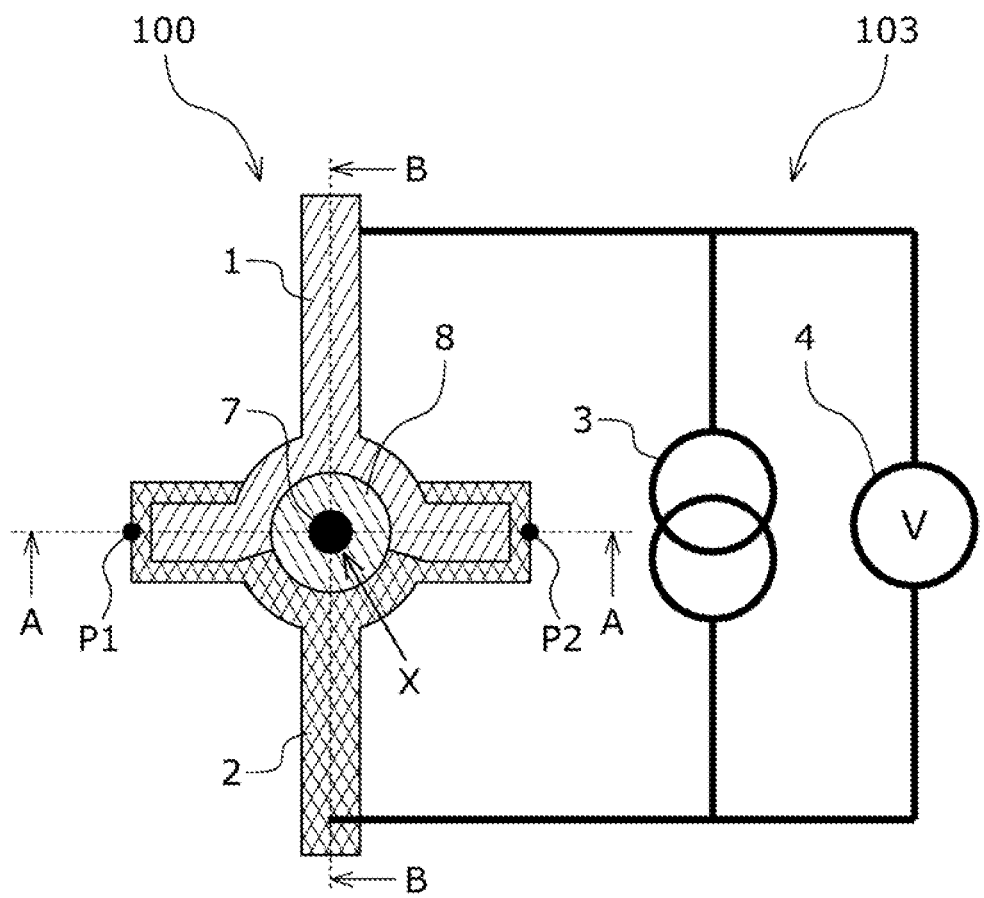
FIG. 1 is a diagram illustrating a structure in which a phase shifter (a superconductor) according to an embodiment of the present invention and a direct-current superconducting quantum phase interference device (DC-SQUID device) serving as a circuit that is used for computation or storage and in which the phase shifter (the superconductor) operates are combined with each other, the structure being viewed from above.
Figure 2:
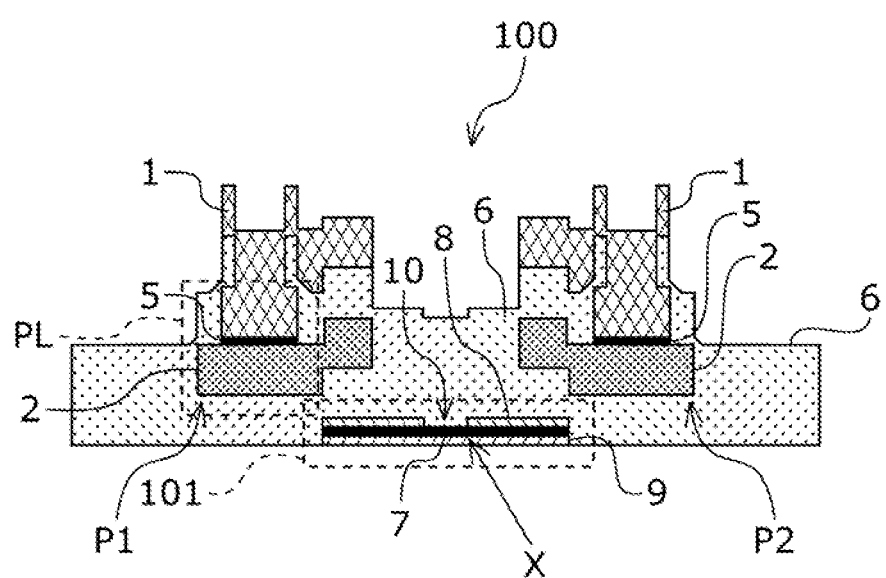
FIG. 2 is a cross-sectional view taken along line A-A of FIG. 1.
Figure 3:
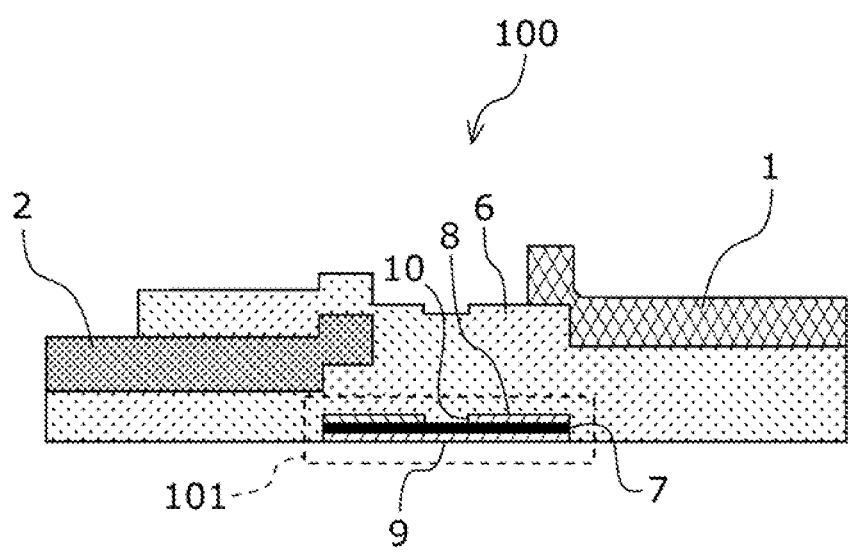
FIG. 3 is a cross-sectional view taken along line B-B of FIG. 1.

FIG. 1 to FIG. 3 embody these features, and a structure according to the present embodiment will be described step by step.

A direct-current superconducting quantum phase interference device 100 (hereinafter also referred to as DC-SQUID device 100) that includes two Josephson junctions serves as a target circuit (a closed-loop circuit to be directly used for computation or storage) 103.

The structure according to the present embodiment includes an upper electrode 1 that is formed of a superconducting wire, a lower electrode 2, a direct-current power supply 3 that causes a bias current to flow between the upper electrode 1 and the lower electrode 2, and a direct-current voltage measuring instrument 4. Note that the upper electrode 1 and the lower electrode 2 each include a current-supply line.

The direct-current voltage measuring instrument 4 measures a voltage when the bias current flows between the upper electrode 1 and the lower electrode 2. When the value of the direct current of the direct-current power supply 3 is gradually increased from zero, a voltage is generated at a certain current value. This current is the critical current of the DC-SQUID device 100.

When a phase shift that is generated by a phase shifter 101 is zero radian, a maximum critical current value ($I_c^{max}$) is obtained. If a phase shift is generated by the phase shifter 101, the value of the critical current is smaller than $I_c^{max}$ (section 6.4.1, p. 215, and FIG. 6.8 (b) of NPL FIG. 2 illustrates a cross-sectional view of FIG. 1 for understanding the structure of the DC-SQUID device 100. FIG. 2 is a cross-sectional view taken along line A-A of FIG. 1. In addition, positions that are common to FIG. 1 and FIG. 2 are denoted by P1 and P2 so as to indicate the correspondence between FIG. 1 and FIG. 2.

The DC-SQUID device 100 includes the upper electrode 1, the lower electrode 2, and a Josephson barrier layer 5 (FIG. 2). In FIG. 2, a portion that is surrounded by a dotted line frame PL is a Josephson junction.

An insulating layer 6 is provided on the lower side of the DC-SQUID device 100. For example, a silicon oxide can be used for the insulating layer 6. Note that the insulating layer 6 is not illustrated in FIG. 1. In addition, the phase shifter 101 that serves as a superconductor is provided on the lower side of the insulating layer 6 (a portion indicated by a dotted line in FIG. 2).

A circuit 103 is provided directly above or directly below the phase shifter 101, and in the present embodiment, a case in which the phase shifter 101 is provided directly below the circuit will be described. Note that the terms "directly below" and "directly above" refer to the case where the distance between the circuit 103 and the phase shifter 101 is about 30 nm to about 1 µm.

The phase shifter 101 is formed by sandwiching a Josephson barrier layer 7 that serves as an ultrathin barrier layer between a first superconducting ultrathin film 8 and a second superconducting ultrathin film 9. In this manner, the phase shifter 101 is a multicomponent superconductor that is formed by alternately stacking superconducting ultrathin films and an ultrathin barrier layer. Note that the multicomponent superconductor may be a multiband superconductor.

In addition, the structure according to the present embodiment causes a quantum phase shift to be generated in the closed-loop circuit 103 by using a fractional flux quantum captured by the phase shifter 101.

The first superconducting ultrathin film 8 has a hole 10. The hole 10 may be formed in the first superconducting ultrathin film 8 or the second superconducting ultrathin film 9. Providing the hole 10 facilitates generation of a vortex with a fractional flux quantum and capturing of a fractional flux quantum.

Note that, other than a structure in which a hole is formed only in the first electroconductive ultrathin film 8, a through hole extending between the front surface and the rear surface of the phase shifter 101 may be provided. In this case, a fractional flux quantum is generated in the through hole.

For example, niobium can be used for the first superconducting ultrathin film 8 and the second superconducting ultrathin film 9. The first superconducting ultrathin film 8 and the second superconducting ultrathin film 9 each need to have a thickness smaller than a London penetration depth. Thus, in the case of using niobium that has the London penetration depth of about 80 nm to about 100 nm, although it is preferable that the first superconducting ultrathin film 8 and the second superconducting ultrathin film 9 each be thinner than the London penetration depth, they can also be made thicker by adding impurities or the like so as to further increase the London penetration depth. In addition, for example, aluminum that has become alumina by oxidizing its surface can be used for the Josephson barrier layer 7, and such aluminum having a thickness of, for example, 5 nm can be used. It is preferable that the thickness of the Josephson barrier layer 7 be 20 nm or smaller.

This structure is brought into a state (an ON state) in which it exhibits a function by applying a magnetic field larger than a lower critical current to the phase shifter 101 so as to generate a fractional vortex having a fractional flux quantum, or by cooling the phase shifter 101 starting from a temperature higher than the superconducting transition temperature to the superconducting transition temperature or lower while a magnetic field is applied to the phase shifter 101 so as to generate a fractional vortex.

In other words, a fractional vortex having a fractional flux quantum is generated in the phase shifter 101, and a fractional flux quantum is generated concomitantly with a vortex filament that is generated in the phase shifter 101. The fractional flux quantum associated with the fractional vortex passes through the inside of the DC-SQUID device 100, so that a vector potential is generated in a ring of the DC-SQUID device 100. As a result, as expressed by Equation (2), a phase offset is generated.

Note that it is preferable that the vortex filament be pinned to a pinning center for restricting movement of the vortex filament in the phase shifter 101.

In addition, the center of the fractional vortex is likely to be located at the edge of the hole 10 (NPL 34 to NPL 36). An exemplary place where the fractional vortex is present is indicated by arrow X. However, the amount of phase shift caused by the phase shifter 101 does not change no matter where the fractional vortex is located at the edge of a circle.

FIG. 3 illustrates a cross-sectional view taken along line B-B of FIG. 1 for reference.

As a device for checking the function of the phase shifter 101, a voltage amplification function by series connection can also be provided. A method of providing this voltage amplification function is also a very effective amplification method in the case where the phase shifter 101 is "an unknown multicomponent superconductor candidate material" and where its function is desired to be checked. In addition, noise is reduced by connecting the DC-SQUID devices 100 in series.

It is known that the signal strength of the DC-SQUID device 100 is proportional to the number of the DC-SQUID devices 100 connected in series and that noise is inversely proportional to the square root of the number of the DC-SQUID devices 100 connected in series (NPL 39). Thus, the S/N ratio is improved in proportion to the number of the DC-SQUID devices 100 connected in series to the power of 1.5. For example, in a structure in which 100 DC-SQUID devices 100 are connected in series, the S/N ratio is increased by three orders of magnitude.

Figure 4:
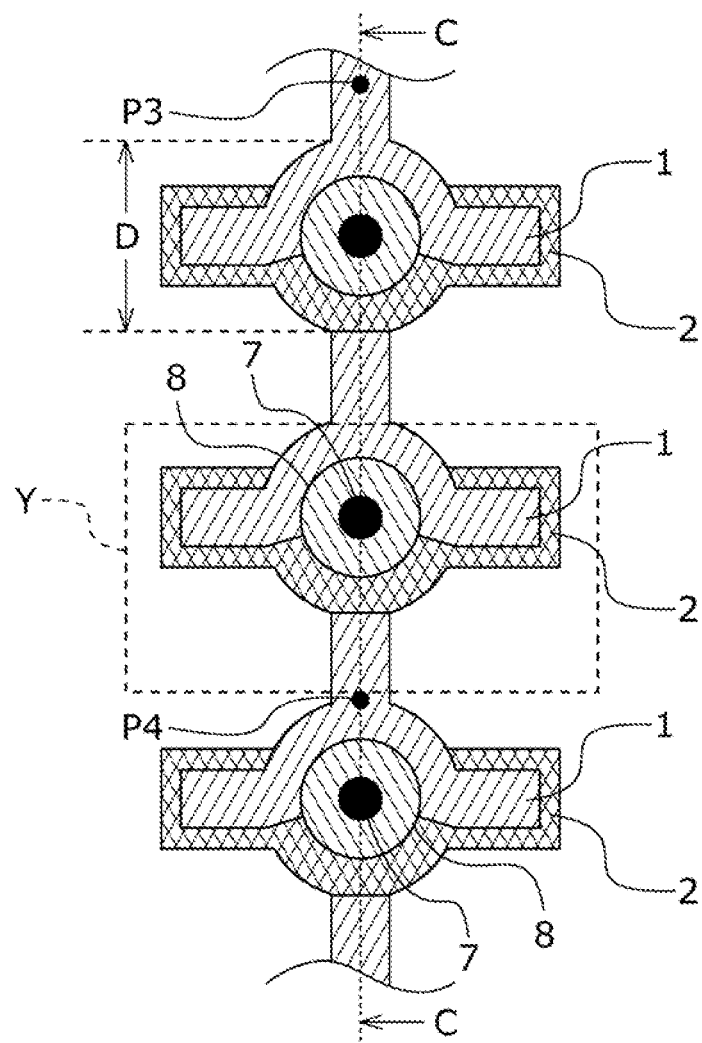
FIG. 4 is a diagram illustrating a structure in which elements illustrated in FIG. 1 are connected in series.

FIG. 4 illustrates a portion of a structure in which the DC-SQUID devices 100 are connected in series. A portion that is surrounded by a dotted line frame Y is a single unit, and this corresponds to the element illustrated in FIG. 1.

Figure 5:
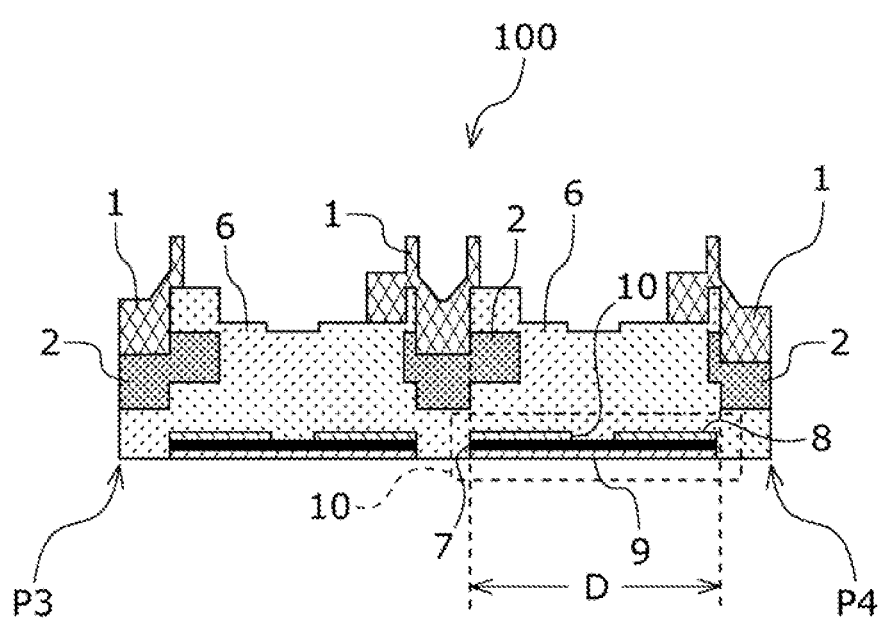
FIG. 5 is a cross-sectional view taken along line C-C of FIG. 4.

FIG. 5 illustrates a cross-sectional view taken along line 210 in FIG. 4 in order to describe the state where the DC-SQUID devices 100 are connected in series. Note that the insulating layer 6 is not illustrated in FIG. 4. In addition, positions that are common to FIG. 4 and FIG. 5 are denoted by P3 and P4 so as to indicate the correspondence between FIG. 4 and FIG. 5.

The structure illustrated in FIG. 4 can be achieved by, for example, using niobium as a superconducting material. In this case, it is appropriate to use aluminum that has become alumina by oxidizing its surface for the Josephson barrier layer 7. In addition, a silicon oxide can be used as the insulating layer 6. All of these layers can be formed by being stacked on a silicon substrate.

A material used for the phase shifter 101 and a material used for the DC-SQUID device 100 may be the same as each other.

The thickness of a niobium layer of the phase shifter 101 can be set to 20 nm, and the thickness of an aluminum and alumina layer can be set to 5 nm. The distance between the phase shifter 101 and the upper electrode 1 can be set to 100 nm, and the thickness of the upper electrode 1 can be set to 200 nm. The thickness of the lower electrode 2 can be set to 200 nm, and the distance between the upper electrode 1 and the lower electrode 2 excluding a joint portion can be set to 300 nm.

In addition, each of the junctions of the DC-SQUID device 100 is fabricated by placing aluminum on the lower electrode 2, placing the upper electrode 1 on the aluminum, and further providing a wiring line (300 nm). More specifically, each of the junctions is fabricated by providing aluminum that has a thickness of 5 nm and whose surface is oxidized as a barrier on the upper side of the lower electrode 2 and further placing a niobium layer having a thickness of 200 nm. In addition, an insulating layer that is made of a silicon oxide and that has a thickness of 300 nm is placed on the niobium layer. Furthermore, only at an upper portion of the niobium layer, which has been stacked on the barrier layer and which has a thickness of 200 nm, a hole called a contact hole is formed in the silicon oxide insulating layer. After that, the upper electrode 1 made of niobium is formed, and the upper electrode 1 can also be integrated with the niobium layer, which has been stacked on the barrier layer and which has a thickness of 200 nm. (In FIG. 4, the niobium layer, which has been stacked on the barrier layer and which has a thickness of 200 nm, is illustrated as being integrated so as to be a portion of the upper electrode 1.) In addition, with the configuration illustrated in FIG. 5, a structure in which 100 DC-SQUID devices 100 are connected in series can also be fabricated.

If the outer diameter D and the inner diameter of the SQUID ring are respectively set to 10 µm and 6 µm, the outer diameter of the phase shifter 101 is set to 10 µm, and the outer diameter of the hole 10 formed in the first superconducting ultrathin film 8 is set to 2 µm, it can be fabricated by a normal process.

A functional device can be manufactured by setting the design value of the Josephson critical current density of the phase shifter 101 and the design of the critical current of a single junction included in the DC-SQUID device 10 to 300 A/cm$^2$ and about 40 µA, respectively.

There are two methods for generating a fractional flux quantum in the above-described structure. One of the methods is a method of generating a fractional flux quantum by cooling the phase shifter 101 without applying a magnetic field thereto starting from a temperature above the superconducting transition temperature to a temperature lower than the superconducting transition temperature and then applying a magnetic field to the phase shifter 101 at a temperature lower than the superconducting transition temperature. The other of the methods is a method of generating a fractional flux quantum by cooling the phase shifter 101 while a magnetic field is applied thereto starting from a temperature above the superconducting transition temperature to a temperature lower than the superconducting transition temperature.

Figure 6:
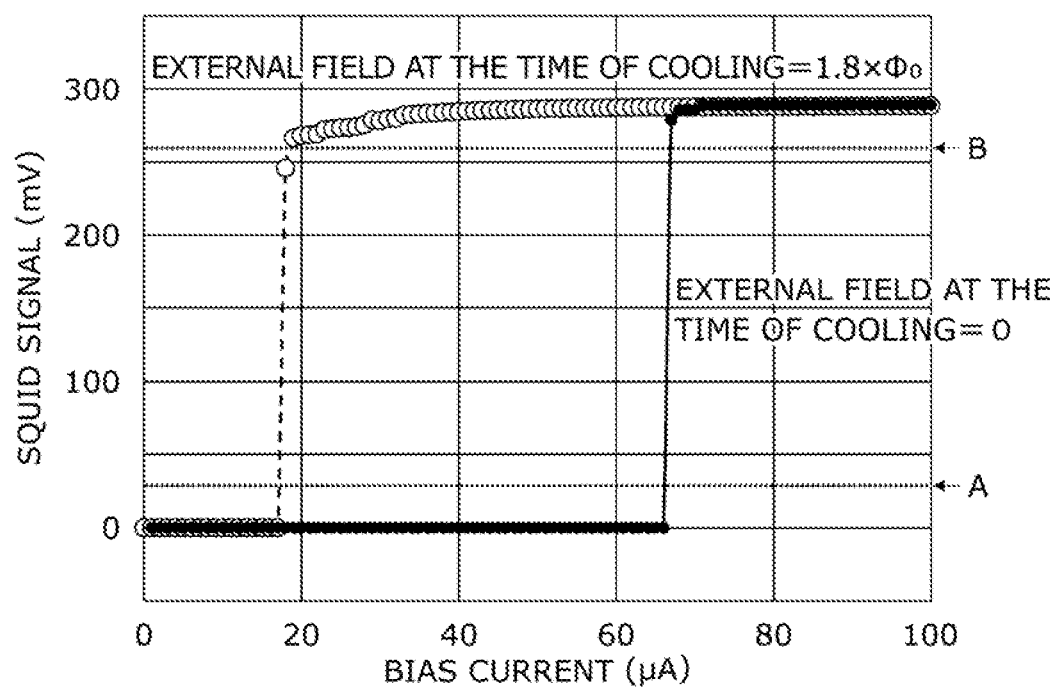
FIG. 6 is a graph illustrating a state in which phase shifters operate in the elements illustrated in FIG. 4 and measurement results.

A measurement result of a characteristic of a series circuit of the DC-SQUID devices 100 with the above-described structure obtained by cooling the circuit starting from a temperature equal to or higher than the superconducting transition temperature while applying a magnetic field thereto and then turning off the magnetic field is illustrated in FIG. 6. FIG. 6 also illustrates a characteristic of the circuit in the case where the circuit is cooled without applying a magnetic field thereto.

In the case where the circuit is cooled without applying a magnetic field thereto (in the case of cooling without magnetic field), when the bias current of each of the DC-SQUID devices is incremented by 1 µA starting from 0 µA, a voltage appears at 67 µA. In other words, it is surmised that the critical current of each of the DC-SQUID devices is 66 µA or greater and less than 67 µA.

In contrast, when the characteristic of each of the DC-SQUID devices is checked after decreasing a temperature equal to or higher than the superconducting transition temperature to a temperature equal to or lower than the superconducting transition temperature while a magnetic flux quantum of that is 1.8 times a magnetic flux quantum (Φ0), that is, a magnetic flux of about of 1.8×Φ0 is applied to each of the DC-SQUID devices and reducing the magnetic field to zero at the low temperature, the voltage appears at 18 µA. In other words, it is surmised that the critical current of each of the DC-SQUID devices is 17 µA or greater and less than 18 µA.

In this case, since the 100 DC-SQUID devices 100 are connected in series, at least one fractional vortex is present in the phase shifter 101 in almost each of the 100 DC-SQUID devices 100, and the function of the phase shifter 101 is in the ON state.

Even if a normal vortex having a normal magnetic flux quantum (Φ0) is present in the phase shifter 101, the amount of a phase shift that is generated is two π radian, and this has no effect of shifting the phase of the DC-SQUID device 100. In other words, even if a normal vortex is present in the phase shifter 101, the phase shifter 101 will not be turned on, and even if a normal vortex is present together with fractional vortex in the phase shifter 101, it will not contribute to a phase shift.

Figure 7:
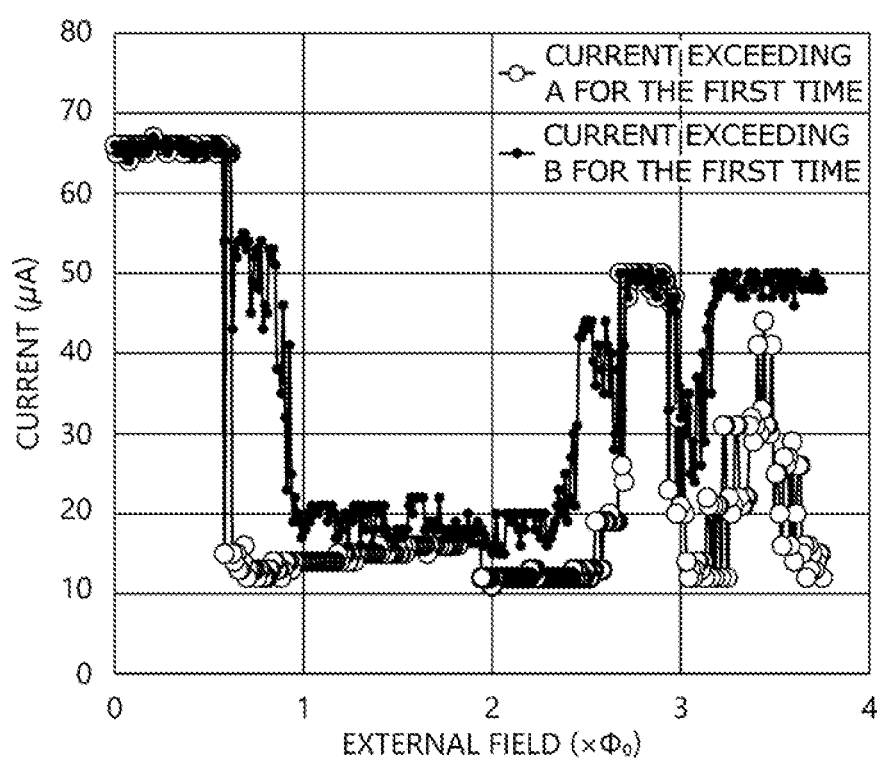
FIG. 7 is a graph illustrating results of measurements performed by changing a magnetic field at the time of cooling with respect to the phase shifters in the elements illustrated in FIG. 4 and by turning on and off functions of the phase shifters.

Results of measuring the ON state and the OFF state of the phase shifter 101 with respect to the DC-SQUID device 100 by changing the magnetic field at the time of cooling are illustrated in FIG. 7.

In this case, FIG. 7 illustrates a current exceeding a voltage (A in FIG. 7) that is 10% of the maximum value of the voltage, which is illustrated in FIG. 6, for the first time and a current exceeding (B in FIG. 7) that is 90% of the maximum value of the voltage, which is illustrated in FIG. 6, for the first time. Since the voltage is the sum of voltages generated in the 100 DC-SQUID devices 100, the line representing the 10% voltage serves as a guide for determining that the phase shifters 101 for about 10 of the DC-SQUID devices 100 are turned on, and the line representing the 90% voltage serves as a guide for determining that the phase shifters 101 for about 90 of the DC-SQUID devices 100 are turned on.

It is understood that, in a wide range of the external field at the time of cooling from Φ0 to 2Φ0, that the phase shifters 101 shift the phases of almost all the 100 DC-SQUID devices 100 by the same degree. In other words, the phase shift amount can be controlled only with the structure of a device without precisely controlling the magnetic field at the time of cooling.

A closed-loop circuit that includes a plurality of Josephson junctions is a direct-current superconducting quantum phase interference device, and a fractional flux quantum can also be detected by using a direct-current superconducting quantum phase interference device (a detection method). In this detection method, a signal of the direct-current superconducting quantum phase interference device 100 may be a voltage that is generated with respect to a DC bias current, and the signal of the direct-current superconducting quantum phase interference device 100 may be the critical current of the direct-current superconducting quantum phase interference device 100. In addition, in this detection method, a plurality of direct-current superconducting quantum phase interference devices 100 is connected in series in a state where the phase shifters 101 are each arranged directly above or directly below one of a plurality of closed-loop circuits 103, so that the voltage generated in the direct-current superconducting quantum phase interference devices 100 can be amplified.

By using the detection method, an absolute amount of the fractional flux amount of a fractional flux quantum can be evaluated. In addition, in the detection method, it can be determined whether the phase shifter 101 that is in close contact with the direct-current superconducting quantum phase interference device 100 is multicomponent superconductive by detecting a fractional flux quantum (determination method). Furthermore, this determination method can also be used to search for a multicomponent superconducting material (a searching method).

Advantageous effects of the structure and the like that have been described in the present embodiment will now be described.

In the structure described in the present embodiment, the phase shifter 101 and the circuit 103 are DC-separated from each other, and thus, it is extremely easy to design a circuit. Basically, the circuit 103 and the phase shifter 101 vertically overlap each other, and thus, the bulkiness of a phase shifter in the area direction of a circuit, which has been mentioned as a problem in NPL 11 and NPL 12, is eliminated.

In addition, the phase shifter 101 is disposed directly under the circuit 103, and thus, leakage of a magnetic field to places other than the circuit 103 can be minimized. Note that also in the case where the phase shifter 101 is disposed directly above the circuit 103, a similar effect can be obtained. The fact that a magnetic flux is likely to concentrate around a hole or a vortex also provides the effect of suppressing leakage of a magnetic field to places other than the circuit 103.

In the case of a bi-layer film that is formed by sandwiching the Josephson barrier layer 7 between the first superconducting ultrathin film 8 and the second superconducting ultrathin film 9, which are the same type of superconducting ultrathin films, the fractional flux amount is absolutely determined by the ratio between the thicknesses of the films (NPL 35). Thus, in particular, a concern about variations in the amount of magnetic flux depending on temperature, which has been mentioned as a problem in NPL 10, is greatly reduced.

In addition, the fractional flux amount can be freely set by the ratio between the thicknesses of the films. This provides a degree of freedom that is not disclosed in the method that uses a π junction in which a phase shift is fixed to π radian (PTL 7 to PTL 10 and NPL 16 to NPL 30). In addition, the phase shifter 101 itself is a superconductor, and thus, it also serves as a noise filter.

A superconductor can only be in a state of allowing specific magnetic flux quanta such as a fractional flux quantum and a unit flux quantum or a state of not allowing any of them and cannot continuously be in an intermediate state between these states.

In other words, fluctuations in the magnetic field near the ring are likely to be suppressed by the phase shifter itself. NPL 11 and NPL 12 also disclose that a ring added for a phase shifter plays a similar role. By playing this role, however, a Meissner current or a screening current flows through the ring, which in turn results in noise.

In contrast, according to the present embodiment, the current that flows along the outer edge of the phase shifter 101 is in charge of blocking disturbance. On the other hand, it is a current around a vortex inside the phase shifter 101 (a superconducting disk) or around a hole formed in the phase shifter 101 (i.e., the current flowing along the inner edge) that generates a fractional flux quantum as the phase shifter 101, and thus, it is perfectly protected against disturbance.

The phase shifter 101 that has been described in the present embodiment can be replaced as it is with many memory devices of single-flux-quantum (SFQ) circuits that have been proposed (e.g., NPL 9, NPL 11, NPL 12, NPL 20, and NPL 29) and phase shifters for qubits (NPL 2 to NPL 8, PTL 10, NPL 21, NPL 23, and NPL 27) in principle and has extremely high compatibility with the related art.

In principle, the size of the phase shifter 101 can be reduced to the size of a vortex. With the effect of the thin films, the size of a vortex in the case of niobium can easily be reduced to smaller than 1 μm.

In addition, in the case of selecting niobium as the first superconducting ultrathin film 8 and the second superconducting ultrathin film 9 of the phase shifter 101, all the circuits can be fabricated by the process for niobium. In the case of employing the infrastructure for fabricating a superconducting circuit using niobium, it is not necessary to make any changes to the infrastructure for niobium. In addition, as the infrastructure for niobium, the manufacturing technology is mature, and thus, it is easy to handle. Accordingly, the existing SFQ and qubit technologies can be fully utilized as legacies. Especially for qubits, an external field can be completely replaced with the phase shifter 101 of the present embodiment while suppressing crosstalk with the environment, which has been a problem in the method of using an external field as a phase shifter, to a minimum.

As described above, the structure according to the present embodiment can bring revolutionary changes into both technologies for SFQ memories and qubits.

Note that, although a method of applying a fractional flux quantum to a SFQ memory is also disclosed in NPL 41, no specific technical contents, such as those described in the present embodiment, are disclosed or proposed in NPL 41.

A method for searching for multicomponent superconductivity usable for the phase shifter 101 by detecting a fractional flux quantum is a highly potential application circuit using the present invention. Advantageous effects of this application circuit will be described below.

As described in PTL 6, NPL 33, and NPL 34, in the related art, fractional flux quanta have been determined by using a scanning SQUID magnetic susceptibility microscope. The present invention has the following advantages over the above method and provides great advantageous effects.

The present invention provides a structure in which the distance between a device that detects a magnetic flux and a target sample is small and in which substantially the entire magnetic flux amount of a target fractional flux quantum is guided to a sensing device (a ring of a SQUID) at once.

In contrast, in a method of the related art that uses a scanning SQUID magnetic susceptibility microscope, a gap is generated between a sample and a detection device, the gap being much larger than the gap that can be generated when the sample and the detection device are brought into close contact with each other, and the tendency for a large amount of magnetic flux that does not pass through the detection device to be generated cannot be eliminated (NPL 34). In addition, because of the structure in which a detection coil is spatially scanned so as to detect its magnetic flux amount, unlike the case where all the magnetic flux of a fractional flux quantum enters the detection coil at once, it is necessary to calculate the total amount by integration after measurement. In the integration, it is necessary to subtract the offset of a measurement system. Due to this subtraction, the fact that there will be large arbitrariness in estimation of an absolute amount cannot be denied. The present invention can suppress this arbitrariness to a minimum.

In addition, it also has a great advantageous effect on convenience relating to measurement. A device such as that disclosed in NPL 34 involves a large consumption of liquid helium. More specifically, determination of whether a single target sample includes a fractional flux quantum requires consumption of 100 liters of helium and a measurement time of 24 hours or more in total. In addition, the measurement that takes 24 hours or more requires a person who continuously monitors and controls the operation of a measurement system. This is because a person needs to intervene in the measurement approximately every 30 minutes in order to check a measurement location and temperature stability, to monitor the flow rate of helium for temperature control, to monitor whether measurement equipment is operating properly, and to check whether the gap between a sample and a sensor deviates from a proper value with time.

In other words, a fully automated measurement cannot be performed. The device itself is delicate and needs constant repairs to operate, and only a highly skilled person can operate the device. In addition, as described in NPL 42, there has been an imbalance between the supply and demand of helium, resulting in a shortage in the supply of helium, and the price of helium has skyrocketed. In order to cause the device to operate, it is necessary to prepare about 400,000 yen only for liquid helium per experiment. Under this situation, the device is caused to operate only about three times a year, and it actually takes about 20 years to determine a fractional flux quantum. It is impractical to use such a device for searching for a multicomponent superconducting material. In contrast, in application of the present invention, only the following need to be prepared: a basic skill for cryogenic experiment, a freezing store that does not use any liquid helium, measurement equipment having a basic electrical property, and a normal control computer. The existence or nonexistence of a fractional flux quantum can also be determined immediately. In addition, a continuous automatic operation can be easily performed 24 hours 365 days, and it brings great advantageous effects with its advantages.

Although, NPL 43 discloses a method of processing a sample that is subjected to searching and measuring the magnetic susceptibility of the sample, it is clear that the present invention also has an advantage over this method. The technical contents disclosed in NPL 43 will now be briefly described. A hole is formed in a target sample, and the sample is placed onto a cantilever. When a magnetic flux quantum enters the hole, the magnetic flux quantum causes a change in magnetization. It is a method of measuring, with high accuracy, the change in the magnetization by measuring a shift in the resonance frequency of the cantilever.

In such a method, there is always a possibility that a problem concerning evaluation of magnetic susceptibility when there is a magnetic flux amount $\Phi_0$ of a magnetic flux quantum will occur. In other words, a problem is likely to occur in calibration of the amount measured by a measurement device, that is, a calibration process. Although the magnetic flux amount $\Phi_0$ is an absolutely constant amount, how much magnetization a target material has, when the target material has the magnetic flux amount $\Phi_0$, depends on the geometric shape of the target material or the London penetration depth of the target material, which is a superconducting property thereof.

Thus, if calibration that is performed while mistaking the magnetic susceptibility when the target material has a magnetic flux amount $2\Phi_0$, which is twice $\Phi_0$, for the magnetic susceptibility when the target material has the magnetic flux amount $\Phi_0$, is used as a standard, a possibility of drawing a wrong conclusion that the magnetization is obtained by $\Phi_0/2$ despite the fact that the target material has only the magnetic flux amount $\Phi_0$ cannot be eliminated.

In addition, as actually described in NPL 43, magnetization derived from a target magnetic flux quantum is extremely small compared to the background of measurement, and there is also the arbitrariness when its slight change is determined by subtracting the background.

In the present invention, an absolute amount of deviation from the amount of magnetic flux that is an integral multiple of a magnetic flux quantum can be directly estimated as the critical current of the DC-SQUID device 100, and in the first place, there is no background problem such as that mentioned above. In addition, calibration of a magnetic flux quantum $\Phi_0$ is not necessary in principle. These are great advantageous effects that are alternatives to a method of the related art that requires calibration of the magnetic flux quantum $\Phi_0$.

In addition, for reference, the problem concerning calibration of the magnetic flux quantum $\Phi_0$ has not been solved in the fractional flux quantum evaluation technology disclosed in NPL 33 as in the technology disclosed in NPL 43.

In the technology disclosed in NPL 33, an object to be measured has a ring-like shape, and a change in the amount of the current that flows through the ring is measured by replacing it with a change in the mutual induction current with a sensing coil. There is arbitrariness in calibration of the mutual induction coefficient. There is also arbitrariness that comes from a large background. The present invention has an advantageous effect of suppressing these arbitrarinesses to a minimum.

In addition, as described in PTL 11, although a method of applying an alternating-current electric field to a material to be determined and determining from its response whether it is multicomponent has been proposed, an absolute amount of the magnetic flux amount of a generated fractional flux quantum cannot be determined by this method, and in addition, it cannot be determined by this method whether it is applicable to electronics. Also regarding this, the present invention has advantageous effects of determining an absolute amount of a fractional flux quantum and determining applicability to electronics.

Here, in order to avoid misunderstanding, fundamental differences between the technology for measuring a fractional flux quantum disclosed in NPL 16 and the technology disclosed in the present invention will also be described.

NPL 16 discloses a method of forming a closed loop including a junction by using a sample and measuring a fractional flux quantum. This is originally intended to detect a sign inversion of a superconducting order function, and the technical contents are different from those of the present invention. In addition, a feature of the present invention is detecting a phase shift of a superconducting order function that is generated by a target material without the assistance of a junction, and the physical contents are also completely different from those of NPL 16.

Although the embodiment of the present invention has been described above, arbitrary modifications may be freely made within the gist of the present invention. In either case, according to the present invention, by capturing a fractional flux quantum in a phase shifter and overlapping with a target circuit, a phase shift can be easily generated in the target circuit without increasing the area of the circuit. This method enables a circuit design that has a configuration extremely simpler and a high reliability compared to a qubit phase shifter of the related art and a phase shifter in an SFQ circuit of the related art and that easily replaces one in the related art. The present invention provides an innovative measure for improving integration of low-temperature memory, which has been difficult to achieve in superconducting electronics, a long coherence time in a qubit.

REFERENCE SIGNS LIST 1 upper electrode
2 lower electrode
3 direct-current power supply
4 direct-current voltage measuring instrument
5 Josephson barrier layer
6 insulating layer
7 Josephson barrier layer
8 first superconducting ultrathin film
9 second superconducting ultrathin film
10 hole
100 direct-current superconducting quantum phase interference device (DC-SQUID device)
101 phase shifter (superconductor)
103 circuit (closed-loop circuit directly used for computation or storage)
D outer diameter of SQUID ring
X place where fractional vortex is present
Y unit
P1 to P4 position
PL Josephson junction

The invention claimed is:

1. A structure including a superconductor and a closed-loop circuit that is directly used for computation or storage, wherein a quantum phase shift is generated in the closed-loop circuit by using a fractional flux quantum captured by the superconductor that is DC-separated from the closed-loop circuit.

2. The structure according to claim 1, wherein the superconductor is disposed directly above or directly below the closed-loop circuit.

3. The structure according to claim 1, wherein the superconductor is a multicomponent superconductor.

4. The structure according to claim 3, wherein the multicomponent superconductor is formed by alternately stacking superconducting ultrathin films and an ultrathin barrier layer.

5. The structure according to claim 3, wherein the multicomponent superconductor is a multi-band superconductor.

6. The structure according to claim 1, wherein the fractional flux quantum is generated concomitantly with a vortex filament generated in the superconductor.

7. The structure according to claim 6, wherein the vortex filament is pinned to a pinning center for restricting movement of the vortex filament.

8. The structure according to claim 1, wherein the superconductor has a through hole, and wherein the fractional flux quantum is generated in the through hole.

9. The structure according to claim 4, wherein the ultrathin barrier layer is sandwiched between the superconducting ultrathin films, and wherein generation of a vortex with the fractional flux quantum and capturing of the fractional flux quantum are facilitated by forming a hole in one of the superconducting ultrathin films.

10. A method for generating the fractional flux quantum in the structure according to claim 1, wherein the fractional flux quantum is generated by cooling the superconductor without applying a magnetic field to the superconductor from a temperature above a superconducting transition temperature to a temperature lower than the superconducting transition temperature and then applying a magnetic field to the superconductor at a temperature lower than the superconducting transition temperature.

11. A method for generating the fractional flux quantum in the structure according to claim 1, wherein the fractional flux quantum is generated by cooling the superconductor while a magnetic field is applied to the superconductor from a temperature above a superconducting transition temperature to a temperature lower than the superconducting transition temperature.

12. The structure according to claim 1, wherein the closed-loop circuit includes one or more Josephson junctions.

13. A detection method,
wherein the structure according to claim 12, the closed-loop circuit including a plurality of the Josephson junctions is a direct-current superconducting quantum phase interference device, and
wherein the fractional flux quantum is detected by using the direct-current superconducting quantum phase interference device.

14. The detection method according to claim 13,
wherein a signal of the direct-current superconducting quantum phase interference device is a voltage that is generated with respect to a direct-current bias current.

15. The detection method according to claim 13,
wherein a signal of the direct-current superconducting quantum phase interference device is a critical current of the direct-current superconducting quantum phase interference device.

16. The detection method according to claim 13,
wherein a plurality of the direct-current superconducting quantum phase interference devices is connected in series in a state in which a plurality of the superconductors is each arranged directly above or directly below one of a plurality of the closed-loop circuits so as to amplify a voltage generated by the direct-current superconducting quantum phase interference devices.

17. An evaluation method,
wherein an absolute amount of a fractional flux amount of the fractional flux quantum is evaluated by using the detection method according to claim 13.

18. A determination method,
wherein the detection method according to claim 13, it is determined, by detecting the fractional flux quantum, whether the superconductor that is in close contact with the direct-current superconducting quantum phase interference device is multicomponent superconductive.

19. A searching method,
wherein the determination method according to claim 18 is used to search for a multicomponent superconducting material.

* * * * *